United States Patent
Pethe et al.

(10) Patent No.: US 6,933,013 B2
(45) Date of Patent: Aug. 23, 2005

(54) VACUUM DEPOSITION OF DIELECTRIC COATINGS ON VOLATILE MATERIAL

(75) Inventors: Rajiv Pethe, San Jose, CA (US); Pramod Gupta, Cupertino, CA (US); Xianhai Chen, San Jose, CA (US); Alexander Nagy, Santa Cruz, CA (US)

(73) Assignee: Photon Dynamics, Inc., San Jose, CA (US)

( * ) Notice: Subject to any disclaimer, the term of this patent is extended or adjusted under 35 U.S.C. 154(b) by 10 days.

(21) Appl. No.: 10/685,552

(22) Filed: Oct. 14, 2003

(65) Prior Publication Data

US 2005/0079281 A1 Apr. 14, 2005

(51) Int. Cl.$^7$ .................. C23C 14/02; C23C 14/06; G02F 1/061
(52) U.S. Cl. .................... 427/255.7; 427/109; 427/162; 427/164; 427/402; 204/192.14; 204/192.27; 359/245; 359/315
(58) Field of Search .................. 427/109, 162, 427/164, 165, 166, 255.15, 255.7, 402, 419.3; 359/245, 263, 315, 318, 320, 322; 204/192.14, 192.26, 192.27; 349/183, 192, 193

(56) References Cited

U.S. PATENT DOCUMENTS

| | | | | |
|---|---|---|---|---|
| 4,975,168 A | * | 12/1990 | Ohno et al. | 204/192.13 |
| 5,051,308 A | * | 9/1991 | Reed et al. | 428/412 |
| 5,357,356 A | * | 10/1994 | Konuma et al. | 349/93 |
| 5,465,052 A | * | 11/1995 | Henley | 324/770 |
| 5,615,039 A | * | 3/1997 | Henley | 359/257 |
| 6,110,327 A | * | 8/2000 | Rukavina et al. | 204/192.1 |
| 6,128,056 A | * | 10/2000 | Kubota et al. | 349/86 |
| 6,151,153 A | | 11/2000 | Bryan | |
| 6,211,991 B1 | | 4/2001 | Bryan | |
| 2002/0130033 A1 | * | 9/2002 | Beitinger et al. | 204/192.14 |
| 2002/0155280 A1 | * | 10/2002 | Yang | 428/335 |
| 2003/0096056 A1 | * | 5/2003 | Kawamura et al. | 427/66 |

\* cited by examiner

*Primary Examiner*—Shrive P. Beck
*Assistant Examiner*—Wesley D. Markham
(74) *Attorney, Agent, or Firm*—Townsend and Townsend and Crew LLP

(57) ABSTRACT

In order to allow application of any coating under a vacuum over a volatile gelatinous layer, such as polymer dispersed liquid crystal (PDLC) on an optical glass substrate with a transparent electrode, such as indium tin oxide (ITO) on its surface, a layer of an intermediate stress absorbing polymeric material is first applied to cover the volatile gelatinous layer to prevent evaporation and escape of volatiles, thereafter the coating is applied under a very high vacuum using for example a technique called Physical Vapor Deposition (PVD) or sputtering.

4 Claims, 1 Drawing Sheet

VACUUM DEPOSITION OF DIELECTRIC COATINGS ON VOLATILE MATERIAL

CROSS-REFERENCES TO RELATED APPLICATIONS

Not Applicable

STATEMENT AS TO RIGHTS TO INVENTIONS MADE UNDER FEDERALLY SPONSORED RESEARCH OR DEVELOPMENT

Not Applicable

REFERENCE TO A "SEQUENCE LISTING," A TABLE, OR A COMPUTER PROGRAM LISTING APPENDIX SUBMITTED ON A COMPACT DISK

Not Applicable

BACKGROUND OF THE INVENTION

This invention relates to methods for applying coatings to volatile gelatinous surfaces on substrates in a high vacuum, and more particularly this invention relates to thin film deposition of dielectric on liquid crystal on a substrate with specific application to deposition of multilayer optical quality dielectric materials on polymeric liquid crystal materials for use in electro-optic applications.

One of the challenges of manufacturing is the difficulty of vacuum coating of materials that have a tendency to evaporate and decompose under vacuum. One material of interest is polymer dispersed liquid crystal (PDLC) film, the material used in electro-optical modulators to image large surfaces.

The known method for EO modulator fabrication is use of commercial NCAP (nematic curvilinear aligned phase) material in which PDLC is sandwiched between two layers of ITO Mylar® polyester film. The conventional manufacturing process involves lamination of a film to a laminate of NCAP. Two patents, assigned to Photon Dynamics, Inc., describe such processes:

"Modulator Transfer Process and Assembly," Michael A. Bryan, U.S. Pat. No. 6,151,153 (2000).

"Modulator Manufacturing Process and Device," Michael A. Bryan, U.S. Pat. No. 6,211,991 B1 (2001).

The lamination process has the limitation of inconsistent surface flatness, mechanical instability, and extremely low yield in manufacture.

Concurrent techniques under development involve the lamination of a polyester film having a mirror coating onto a layer of light sensitive but volatile material and spin coating processes. (See U.S. patent application 10/685,687 filed concurrently entitled METHOD FOR FABRICATING ELECTRO-OPTIC LIGHT MODULATOR in the names of Xianhai Chen, David Baldwin, and Alexander Nagy, and U.S. patent application 10/686,367 filed concurrently entitled METHOD FOR MANUFACTURING PDLC-BASED ELECTRO-OPTIC MODULATOR USING SPIN COATING in the name of Chen and Nagy). While the mirror surface directly engages the light sensitive material, representing an improvement over prior art techniques, the assembly process is subject to human-introduced errors such as wrinkling of the pellicle, nonuniform adhesion, capture of dust particles and creation of bumps at the time of assembly. What is needed is a structure and a technique to allow direct vacuum coating of materials, thus eliminating the film lamination process.

BRIEF SUMMARY OF THE INVENTION

According to the invention, in order to allow application of any coating under a vacuum over a volatile gelatinous layer, such as polymer dispersed liquid crystal (PDLC) on an optical glass substrate with a transparent electrode, such as indium tin oxide (ITO) on its surface, a layer of an intermediate stress absorbing polymeric material, such as polyurethane is first applied to cover the volatile gelatinous layer to prevent evaporation and escape of volatiles, thereafter the coating is applied under a very high vacuum using for example a technique called Physical Vapor Deposition (PVD) or sputtering. In a specific embodiment applicable to optics, a PDLC layer is first spin coated onto a type BK-7 optical glass sheet or cube, then a polymer-based adhesive layer of a polyurethane water-based emulsion with embedded silica nanoparticles that are chemically nonreactive is applied to protect against the undesired evaporation of the liquid crystal material, to absorb stress and to improve the adhesion of a dielectric layer, namely the dielectric mirror coatings. Finally, multi-layer stacks of two different materials having respective high and low refractive indices are consecutively deposited on the adhesive layer under a very high vacuum by Physical Vapor Deposition/Sputtering. The multi-layer stacks of high and low refractive indices form a wavelength selective high reflectivity optical reflector conjoined to the surface of the liquid material tuned to the specific wavelength at which the electro optic modulator operates.

While the principal advantage of this invention is the prevention of evaporation and of breakdown of the water-based emulsion so that coatings can be applied under vacuum, a further advantage of the invention is the elimination of all manual handling-related processing errors, thus improving the overall yield. It also improves optical quality by elimination of air bubbles between the dielectric coating and PDLC layer due to very high adhesion and conformal coating of dielectric thin films. It is estimated that overall manufacturing cost of the EO modulator is reduced by at least 75%.

The invention will be better understood by reference to the following detailed description in connection with illustrations of specific embodiments.

DETAILED DESCRIPTION OF THE INVENTION

Figure 1:
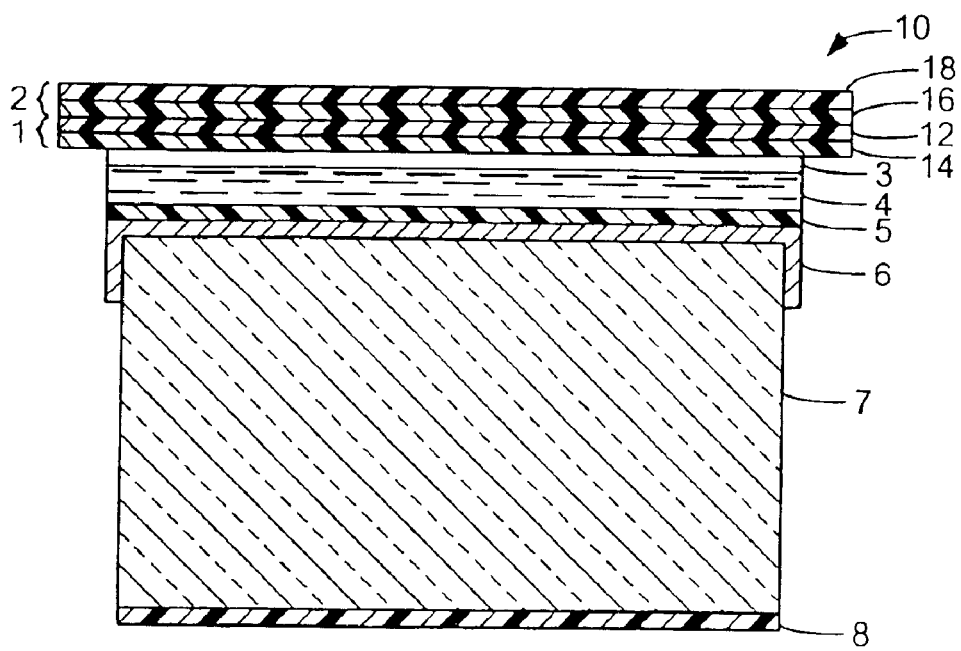
FIG. 1 is a schematic cross-sectional view of a device manufactured according to the invention.

Referring to FIG. 1, there is shown a schematic cross-sectional view of an electro optic modulator device 10 manufactured according to the invention. This is only one example of a device manufactured according to this process.

In an optical element application, EO modulator 10 has at least two pairs 1, 2 of thin dielectric materials 12, 14, 16, 18 of alternately high and low index of refraction overlay a stress-absorptive polymeric adhesive layer 3. The polymer adhesive layer 3 has distinct characteristics as will be explained. The pairs 1, 2, which are not shown to scale, are bonded via the stress-absorptive polymeric adhesive layer 3 on a layer of volatile gelatinous material 4, specifically in an optical application, polymer dispersed liquid crystal (PDLC), which serves as the sensor material 4. The sensor material 4 rests on an optional layer of silicon dioxide 5. Thereunder is a layer of a transparent electrode material 6, such as indium tin oxide (ITO) which in turn is formed on an optical glass substrate 7, which is for example type BK-7 glass. The glass substrate 7 is a plate or solid optically flat sheet which has an antireflective coating 8 on the optically-smooth surface opposing the surface carrying the sensor material 4.

The stress absorptive polymer adhesive layer 3 is a critical element in the manufacturing of the device 10. Material, known to be suitable are water-based adhesives. They must be able to coat over the gelatinous sensor material 4 without damaging the sensor material surface. They must be able to cure to a state where they both retain integrity and are substantially impermeable. Suitable materials include polyurethane dispersions such as Neorez brand R-967 manufactured by Neoresins of Wilmington, Mass., acrylate dispersions, and waterborne epoxies. The adhesives must be water based to be compatible with the sensor material, and they contain for example dispersions of silica ($SiO_2$) or other low refractive index dielectric nanoparticles that are not chemically reactive and which help in the hardening of the adhesive layer 3.

Figure 2:
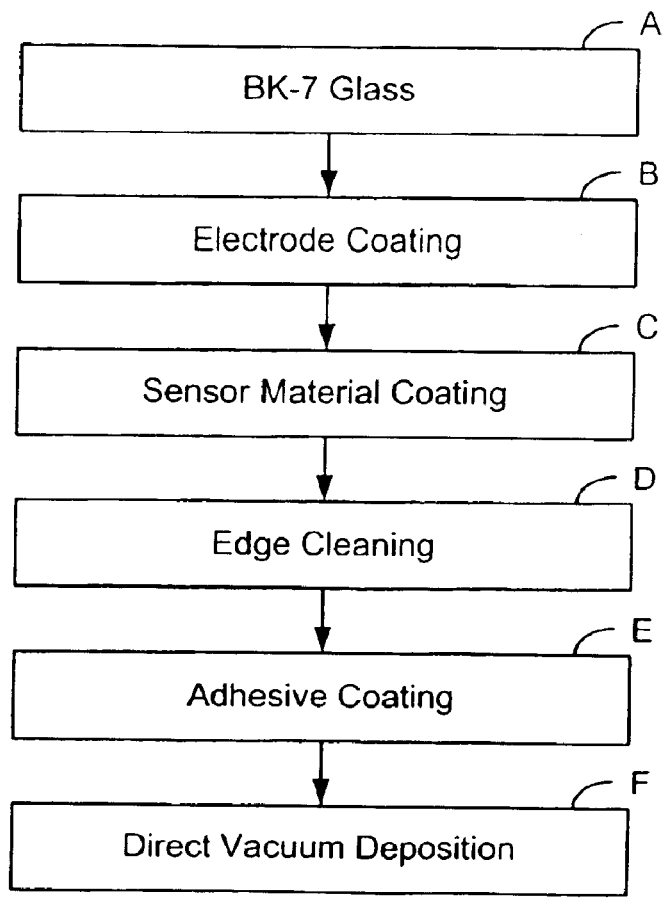
FIG. 2 is a flow chart of the process according to the invention.

Referring to FIG. 2, the process of fabricating an EO sensor 10 according to the invention is illustrated. The prestep is the provision of the optical glass substrate 7, namely a plate of BK-7 glass, which may be precoated with an antireflective layer 8 (Step A).

1) Electrode coating on optical glass substrate: As a first step in the fabrication process, an electrode coating is applied to the optical surface of the glass substrate 7 (Step B). Any transparent conductive coating can be used for this application. Indium tin oxide (ITO) is preferred. Optionally as part of Step B, a layer of silicon dioxide ($SiO_2$) 4 may be overlaid on top of the conductive coating 6, which improves its durability, surface wetting properties, and adhesion with sensor materials 4. This source material can be acquired as a stock component.

Volatile material coating: The volatile material, which in this case is a sensor material, is applied over the electrode 6 and optional layer 7 (Step C). The invention may be used with any volatile material suitable for coating and in need of some protection against a vacuum. In the present use, however, the material is gelatinous and has an electro-optical response. The preferred material includes polymer dispersed liquid crystal (PDLC), which is typically 60–70% liquid crystal, and the remainder is a neutral binder or thickening material such as i) TL-205/AU1033 type liquid crystal/thickening agent combination; ii) TL-205/PMMA type liquid crystal/poly(methyl methacrylate) binder combination; ii) E7 type poly(methyl methacrylate)(PMMA); or iv) E7/AU-1033 type liquid crystal/thickening agent combination. In the fabrication process, the coating processes useful are doctor blade, wired bar, slot die, spin, and meniscus. Spin coating is preferred.

3) Edge cleaning: Thereafter, depending on the coating method, edge cleaning might be needed (Step D). It is preferred to use a plastic 'knife' (such as Mylar® polyester sheet not shown) to remove the edge without damaging the ITO coating.

4) Barrier Adhesive coating: Thereafter a thin adhesive layer 3, namely the stress relief layer and evaporation barrier is applied to the stack (Step E). Application can be by way of spin coating, sputtering, spraying or the like. This step is key to enable direct vacuum-based deposition.

5) Direct Deposition of layers on Spin Coated Adhesive Layer/PDLC: Using pulsed DC argon ion sputtering in a high-vacuum deposition chamber, thin layers of material are deposited over the barrier adhesive layer (Step F).

In a specific application, pairs 1, 2 in the multi-layer stack are formed of two different materials having respective high and low refractive indices. They are alternately deposited first on the barrier adhesive layer under a very high vacuum by Physical Vapor Deposition/Sputtering, such as DC argon ion sputtering, and then repeated for the next layer on the surface of the deposited layer. The length of exposure to the deposition process at a selected temperature and vacuum pressure determines the thickness of each coating. The depth of each coating is selected as a function of the wavelength of desired reflection according to known techniques taking into account the indices of refraction of each layer. The layer of each pair that is on the back side relative to the incident optical radiation has a lower index of refraction in order to promote reflection. The combination of thickness, index of refraction and number of layers determines the wavelength and selectivity of the optical reflection. The reflector stack is specifically designed for a very high reflectivity at the specific wavelength bands at which the electro optic modulator operates.

The direct deposition process in an exemplary system is in a vacuum chamber that has two sputtering targets: high purity Tantalum (Ta) and Silicon (Si). After BK-7 glass cubes spin that have been coated with adhesive/PDLC layers, the cubes are placed on a water-cooled rotating platform in the vacuum chamber. This stage maintains the temperature of the samples between 0–40 C during deposition. The vacuum chamber is then pumped down until the base pressure reaches approximately $10^{-7}$ torr vacuum. The deposition chamber is back filled with argon and oxygen. The oxygen forms a very thin sheath of the respective oxides, i.e., $Ta_2O_5$ or $SiO_2$ on the interior components of the chamber, including the workpiece.

Next, one of the targets is biased negative with respect to ground. This causes ionization of the argon, which causes the Ar+ ions to bombard the face of the target. Through momentum transfer the oxide is removed from the face of the target and gets deposited on the BK-7 glass cube. The power is left on until the appropriate film thickness has built on the substrate.

The second target is then turned on and activated in a similar manner. The power to this target is left on until the appropriate thickness is reached.

The preceding two steps are repeated until the desired number of layers of desired thickness is achieved. In one embodiment, eleven alternating layers.

Other vacuum deposition processes may be exploited also. Examples are such as Ion Assisted Deposition (IAD), Electron Beam (E-Beam) Evaporation, Ion Beam Sputtering (IBS), and Radio Frequency (RF) Sputtering, which, like pulsed DC Argon Ion Deposition, can also be used for dielectric mirror deposition.

The barrier adhesive layer comprises a composition of de-ionized water, surfactant, polyurethane and silica nanoparticles in suspension. In a specific mix, de-ionized water has added to it the surfactant, such as Silwet L-7608, Silwet 7650, or Silwet 7680 surfactants (Witco Products), which acts to assist in spreading the material on the target surface; also polyurethane, such as Neorez brand #R-967, R-960, and R-9649 polyurethanes (Neoresins, Inc. of Wilmington, Mass.); and a water-based suspension of silica nanoparticles that serve as the hardening agent, much as Snowtex brand ST-50, ST-C or the like silica solutions (U.S. source: Nissan Chemical America Corporation of Houston, Tex.).

The alternating eleven-layer stack of high index ($Ta_2O_5$) and low index ($SiO_2$) dielectric materials in a particular embodiment are designed to have 96% reflectivity at 660 nm wavelength. This involves a $Ta_2O_5$ film thickness of 80 nm and a $SiO_2$ film thickness of 115 nm. In the present use, the first layer deposited is the higher index $Ta_2O_5$.

The silica nano-particles play an important role. After completion of the spin coating of the adhesive layer, the water and the surfactant material evaporate, leaving a polymer matrix embedded with silica particles. The nano-particles help in the prevention of liquid crystal evaporation from the underlying PDLC layer and the stresses in the cured or newly-formed protective adhesive film subsequently induced by overlying dielectric films. The silica particles range in size from 10 nm to 100 nm. The weight percentage of the silica in the emulsion ranges between 20–50%. When cured, the silica particles are reasonably densely packed. It is this densely packed structure that prevents the evaporation of the liquid crystal material from the underlying PDLC layer. The structure of silica particles also gives additional mechanical strength to the adhesive film, which help in absorbing the dielectric film stresses. If the silica nano-particles content in the film becomes too large, however, the film stresses in the adhesive coating cause the adhesive coating to stretch and crack. On the other hand, too low of a silica nano-particle content causes the film to contract or wrinkle when placed in vacuum. The exact silica nano-particles content is dependent on the amount of liquid crystal in the PDLC layer.

The optimum composition for applications involving deposition on PDLC is: Water 4 gm+L-7608 0.142 gm+R-967 4 gm+ST-50 silica solution 10 gm. The composition is a colloidal suspension that is strongly dependent on its cure and interaction with the polymer matrix and liquid and liquid crystal content of the receiving layer.

The invention has been explained with respect to specific embodiments. Other embodiments will be evident to those of ordinary skill in the relevant art. It is therefore not intended that the invention be limited, except as indicated by the appended claims.

What is claimed is:

1. A method for directly coating a volatile gelatinous material for use in a high vacuum environment comprising:

applying a layer of volatile gelatinous material onto a substrate;

applying a stress absorbing polymeric layer of adhesive material to the surface of the volatile gelatinous material and allowing it to cure as a coated substrate; thereafter imposing a high vacuum upon the coated substrate; and coating the stress absorbing polymeric layer of the coated substrate with intended materials by physical vapor deposition, wherein said intended materials are dielectric layers formed in pairs of low and high index of refraction materials.

2. The method according to claim 1 wherein the volatile gelatinous material is polymer dispersed liquid crystal.

3. A method for directly applying dielectric layers to polymer dispersed liquid crystal material for use in a high vacuum environment to form an electro-optic modulator comprising:

applying a layer of polymer dispersed liquid crystal onto a substrate having an optically-transparent electrode on its surface;

applying a stress absorbing polymeric layer of adhesive material to the surface of the polymer dispersed liquid crystal; and coating the stress absorbing polymeric layer with a plurality of layers of dielectric material by physical vapor deposition to form a mirror.

4. The method according to claim 3 wherein said plurality of dielectric layers have a reflectivity at a specific wavelength band at which the electro optic modulator operates.

* * * * *